United States Patent
He et al.

(10) Patent No.: US 9,484,201 B2
(45) Date of Patent: Nov. 1, 2016

(54) EPITAXIAL SILICON GERMANIUM FIN FORMATION USING SACRIFICIAL SILICON FIN TEMPLATES

(71) Applicant: International Business Machines Corporation, Armonk, NY (US)

(72) Inventors: Hong He, Schenectady, NY (US); Juntao Li, Cohoes, NY (US); Junli Wang, Singerlands, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/628,375

(22) Filed: Feb. 23, 2015

(65) Prior Publication Data

US 2016/0247677 A1    Aug. 25, 2016

(51) Int. Cl.
*H01L 31/0328* (2006.01)
*H01L 21/02* (2006.01)
*H01L 27/12* (2006.01)

(52) U.S. Cl.
CPC ... *H01L 21/02636* (2013.01); *H01L 21/02381* (2013.01); *H01L 21/02532* (2013.01); *H01L 27/1211* (2013.01)

(58) Field of Classification Search
CPC .............. H01L 21/02636; H01L 21/02532; H01L 21/02381; H01L 27/1211
See application file for complete search history.

(56) References Cited

U.S. PATENT DOCUMENTS

| | | | |
|---|---|---|---|
| 7,198,995 B2 | 4/2007 | Chidambarrao et al. | |
| 7,348,225 B2 | 3/2008 | Zhu | |
| 7,772,048 B2 | 8/2010 | Jones et al. | |
| 7,993,999 B2 | 8/2011 | Basker et al. | |
| 8,395,195 B2 | 3/2013 | Chang et al. | |
| 8,420,471 B2* | 4/2013 | Anderson | H01L 21/82341 257/E21.618 |
| 8,455,364 B2 | 6/2013 | Kanakasabapathy | |
| 8,497,177 B1 | 7/2013 | Chang et al. | |
| 8,513,073 B1 | 8/2013 | Basker et al. | |
| 9,165,837 B1* | 10/2015 | Fronheiser | H01L 21/82382 |
| 2011/0291188 A1 | 12/2011 | Cheng et al. | |
| 2016/0049513 A1* | 2/2016 | Kavalieros | H01L 29/66795 257/192 |

OTHER PUBLICATIONS

Hong He, et al., "Epitaxial Silicon Germanium fin Formation Using Sacrificial Silicon fin Templates", U.S. Appl. No. 15/078,024, filed Mar. 23, 2016.
List of IBM Patents or Patent Applications Treated as Related; Date Filed; Feb. 23, 2015, p. 1-2.
A. Hikavyy et al., "Selective Epitaxial Growth: Trends in a Modern Transistor Device Fabrication," ECS Transactions, vol. 34, No. 1, 2011, pp. 455-465.

* cited by examiner

*Primary Examiner* — Long Pham
(74) *Attorney, Agent, or Firm* — Cantor Colburn LLP; Vazken Alexanian

(57) ABSTRACT

A method of forming semiconductor fins includes forming a plurality of sacrificial template fins from a first semiconductor material; epitaxially growing fins of a second semiconductor material on exposed sidewall surfaces of the sacrificial template fins; and removing the plurality of sacrificial template fins.

14 Claims, 7 Drawing Sheets

EPITAXIAL SILICON GERMANIUM FIN FORMATION USING SACRIFICIAL SILICON FIN TEMPLATES

BACKGROUND

The present invention relates generally to semiconductor device manufacturing and, more particularly, to forming epitaxial silicon germanium (SiGe) and fins for finFET devices using sacrificial silicon fin templates.

Field effect transistors (FETs) are widely used in the electronics industry for switching, amplification, filtering, and other tasks related to both analog and digital electrical signals. Most common among these are metal-oxide-semiconductor field-effect transistors (MOSFET or MOS), in which a gate structure is energized to create an electric field in an underlying channel region of a semiconductor body, by which electrons are allowed to travel through the channel between a source region and a drain region of the semiconductor body. Complementary MOS (CMOS) devices have become widely used in the semiconductor industry, wherein both n-type and p-type transistors (NFET and PFET) are used to fabricate logic and other circuitry.

The source and drain regions of an FET are typically formed by adding dopants to targeted regions of a semiconductor body on either side of the channel. A gate structure is formed above the channel, which includes a gate dielectric located over the channel and a gate conductor above the gate dielectric. The gate dielectric is an insulator material, which prevents large leakage currents from flowing into the channel when a voltage is applied to the gate conductor, while allowing the applied gate voltage to set up a transverse electric field in the channel region in a controllable manner. Conventional MOS transistors typically include a gate dielectric formed by depositing or by growing silicon dioxide ($SiO_2$) or silicon oxynitride (SiON) over a silicon wafer surface, with doped polysilicon formed over the $SiO_2$ to act as the gate conductor.

The escalating demands for high density and performance associated with ultra large scale integrated (ULSI) circuit devices have required certain design features, such as shrinking gate lengths, high reliability and increased manufacturing throughput. The continued reduction of design features has challenged the limitations of conventional fabrication techniques.

For example, when the gate length of conventional planar metal oxide semiconductor field effect transistors (MOSFETs) is scaled below 100 nm, problems associated with short channel effects (e.g., excessive leakage between the source and drain regions) become increasingly difficult to overcome. In addition, mobility degradation and a number of process issues also make it difficult to scale conventional MOSFETs to include increasingly smaller device features. New device structures are therefore being explored to improve FET performance and allow further device scaling.

Double-gate MOSFETs represent one type of structure that has been considered as a candidate for succeeding existing planar MOSFETs. In double-gate MOSFETs, two gates may be used to control short channel effects. A finFET is a double-gate structure that exhibits good short channel behavior, and includes a channel formed in a vertical fin. The finFET structure may be fabricated using layout and process techniques similar to those used for conventional planar MOSFETs.

SUMMARY

In one aspect, a method of forming semiconductor fins includes forming a plurality of sacrificial template fins from a first semiconductor material; epitaxially growing fins of a second semiconductor material on exposed sidewall surfaces of the sacrificial template fins; and removing the plurality of sacrificial template fins.

In another aspect, a method of forming semiconductor fins includes forming a plurality of sacrificial silicon template fins from a silicon layer; epitaxially growing silicon germanium (SiGe) fins on exposed sidewall surfaces of the sacrificial silicon template fins; and removing the plurality of sacrificial silicon template fins.

In another aspect, an intermediate semiconductor structure includes a plurality of sacrificial silicon template fins formed from a silicon layer; a hardmask layer on top surfaces of the sacrificial silicon template fins; epitaxial silicon germanium (SiGe) fins grown on exposed sidewall surfaces of a lower portion of the sacrificial silicon template fins; and sidewall spacers disposed over the epitaxial SiGe fins, and adjacent sidewall surfaces of an upper portion of the sacrificial silicon template fins and the hardmask layer.

BRIEF DESCRIPTION OF THE DRAWINGS

Referring to the exemplary drawings wherein like elements are numbered alike in the several Figures:

FIGS. 1 through 11 are a series of cross sectional views of an exemplary embodiment of a method of forming epitaxially grown fins for finFET transistor devices, in accordance with an exemplary embodiment, in which:

FIG. 1 illustrates the formation of template fins patterned from a silicon-on-insulator substrate;

FIG. 2 illustrates the formation and recessing of a protective, flowable oxide layer the covers lower portions of the silicon template fins;

FIG. 3 illustrates the formation of sidewall spacers adjacent upper portions of the silicon template fins;

FIG. 4 illustrates the removal of the flowable oxide layer to expose lower portions of the silicon template fins;

FIG. 5 illustrates the formation of SiGe fins epitaxially grown on exposed sidewall surfaces of the Si template fins;

FIG. 6 illustrates the removal of a hardmask layer from atop the Si template fins;

FIG. 7 illustrates a dry etching process to remove the exposed Si template fins;

FIG. 8 illustrates the removal of the Si template fins;

FIG. 9 illustrates the removal of the sidewall spacers atop the epitaxially grown SiGe fins;

FIG. 10 illustrates an exemplary gate formation process on the SiGe fins;

FIG. 11 illustrates a perspective view of one of the fins shown in FIG. 10; and

DETAILED DESCRIPTION

Silicon germanium (SiGe) is a promising channel material for FET devices because of its high carrier mobility. In particular, a compressively strained SiGe material provides superior hole mobility as the majority carrier in PFET devices, whether the devices are of a planar geometry or a fin geometry. The epitaxial growth of a SiGe layer on a silicon (Si) substrate, followed by a patterning operation on the SiGe layer (e.g., either by lithography or a spacer image transfer process) is a conventional process for forming the SiGe fins. However, the direct epitaxial growth of a SiGe layer on Si a substrate has a critical thickness limit, which limit also decreases as the concentration of germanium in the SiGe layer increases. Above this critical thickness, the crystal structure of the SiGe becomes defective, and therefore not good for a device channel material. As a result, there is a practical limit for the height of a SiGe fin that may be formed in this matter.

Accordingly, disclosed herein is a method of forming SiGe fins for semiconductor devices in which (in lieu of patterning an epitaxially grown SiGe layer) the SiGe fins are grown from sidewall surfaces of sacrificial silicon template fins. The template fins may be formed at a height that exceeds a desired height of the SiGe fins, such that the once the template fins are removed the remaining SiGe fins have the desired height, and with the desired carrier mobility properties and Ge concentration.

Figure 1:
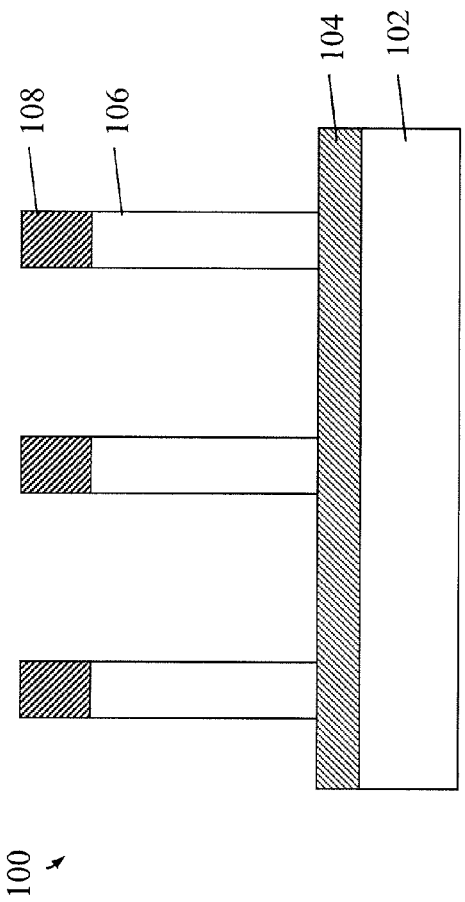

Referring generally now to FIGS. 1 through 11, there is shown a series of cross sectional views of a method of forming epitaxially grown fins for finFET transistor devices, in accordance with an exemplary embodiment. As shown in FIG. 1, a starting semiconductor structure 100 includes a bulk semiconductor layer 102, a buried insulator layer, or more specifically a buried oxide (BOX) layer 104 formed on the bulk semiconductor layer 102, and a plurality of sacrificial template fins 106 patterned from a semiconductor-on-insulator layer, or more specifically a silicon-on-insulator (SOI) layer formed on BOX layer 104. As is known in the art, the bulk semiconductor layer 102 may include a material such as, for example, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials.

The patterning of the sacrificial template fins 106 may be implemented in any suitable manner known in the art, such as by lithographic patterning of a hardmask layer 108, and etching the pattern through the SOI layer down to the BOX layer 104, thereby defining the fins 106. Although the hardmask layer 108 atop the template fins 106 may be any suitable hardmask material, it is preferable that the hardmask layer have an etch selectivity to oxide. Thus, an amorphous carbon material is one such suitable example for the hardmask layer 108.

The initial thickness of the SOI layer should exceed a final desired height of the epitaxially grown SiGe fins, for reasons that will become apparent hereinafter. In one exemplary embodiment, the SOI layer thickness (and hence the height of the sacrificial template fins 106) exceeds 30 nanometers (nm). In addition, the initial pitch (i.e., spacing between adjacent template fins 106) is on the order of about 120 nm, or less. It will also be appreciated, however, that the figures are illustrative only, and that the features shown therein are not necessarily depicted to scale.

Figure 2:
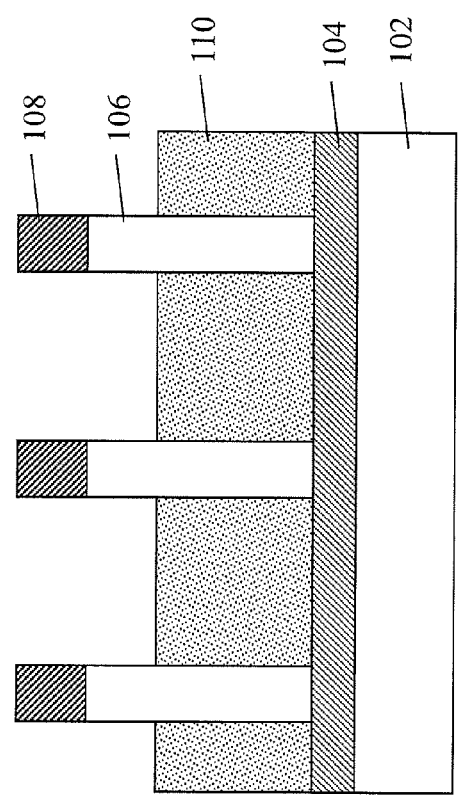

Referring now to FIG. 2, a protective layer 110 is deposited over the structure and thereafter recessed to expose upper portions of the sacrificial silicon template fins 106, temporarily covering lower portions of the template fins 106. In one exemplary embodiment, the protective layer 110 is a flowable oxide (FOX) material that is deposited and recessed. Other materials are also contemplated, however, so long as the protective layer 110 has an etch selectivity with respect to the hardmask layer 108.

Figure 3:
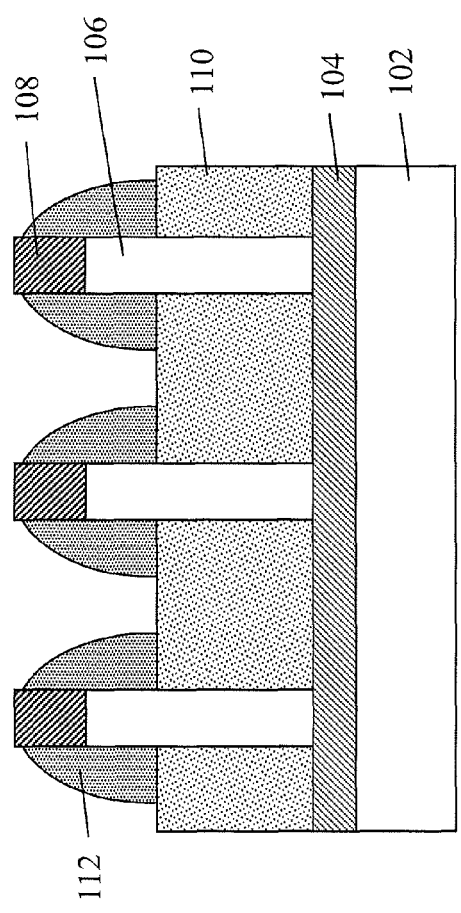
Figure 4:
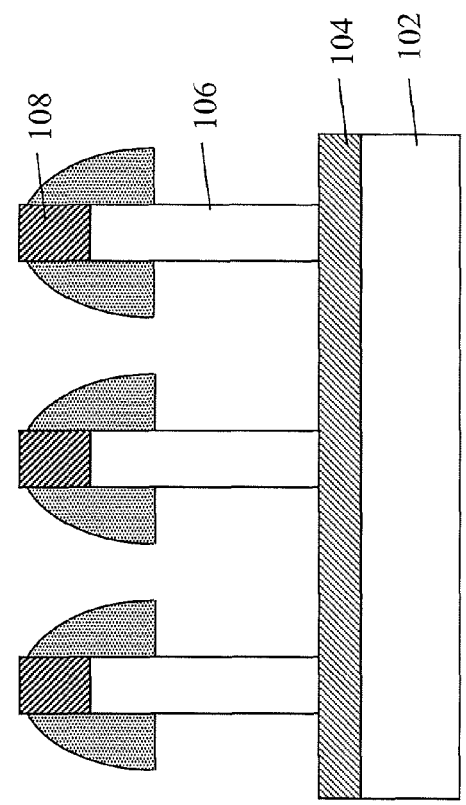

As then shown in FIG. 3, sidewall spacers 112 are formed on sidewalls of the hardmask layer 108 and the exposed upper portions of the sacrificial silicon template fins 106. This may be carried out by, for example, conformally depositing a nitride layer over the top of the protective layer 110, upper portions of the sacrificial silicon template fins 106 and the hardmask layer 108, followed by directional (anisotropic) etching to result in the sidewall spacers 112. In FIG. 4, once the sidewall spacers 112 are formed to cover the upper portions of the sacrificial silicon template fins 106, the protective layer 110 is then removed. Where the protective layer 110 is a flowable oxide layer, a suitable etch is performed to remove the protective layer 110 such that the sidewall spacers 112 and hardmask layer 108 remain substantially intact.

Figure 5:
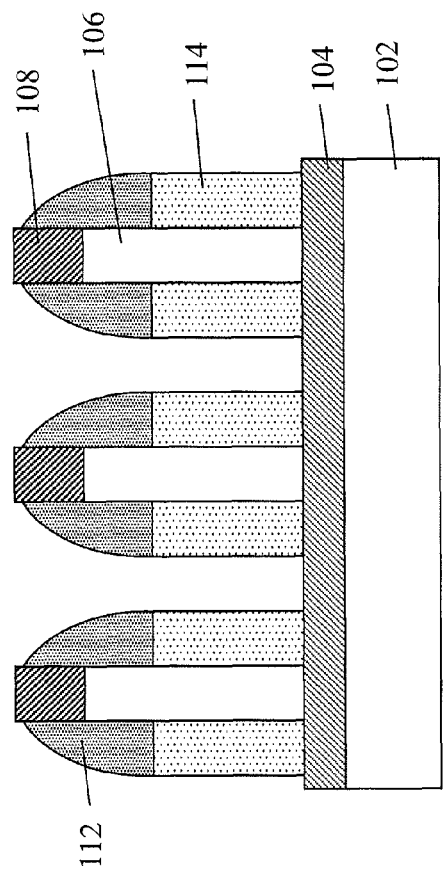

Referring now to FIG. 5, SiGe fins 114 are epitaxially grown on exposed sidewall surfaces of the lower portion of the sacrificial silicon template fins 106. The height of the SiGe fins corresponds to the height of the lower portion of the template fins 106 uncovered by the sidewall spacers 112. This height may be on the order of about 20 nm to about 60 nm, and in one exemplary embodiment, about 30 nm. Again, by using the silicon fins 106 as a growth template instead of growing an entire layer of SiGe on a planar silicon substrate and subsequent patterning/etching, higher SiGe fins may be formed with the desired compressive strain and carrier mobility performance. The Ge content, x, in $Si_{1-x}Ge_x$ may range from about 0.1 to about 0.9, and more particularly, from about 0.2 to about 0.6.

As will be noted, due to the use of the silicon template fins 106 to grow the SiGe fins 114, the resulting pitch of the SiGe fins 114 is double that of the template fins 106. That is, where the silicon template fins 106 are formed at an exemplary pitch where the spacing between adjacent template fins is about 120 nm, then the spacing between adjacent SiGe fins may be on the order of 60 nm or less.

Figure 6:
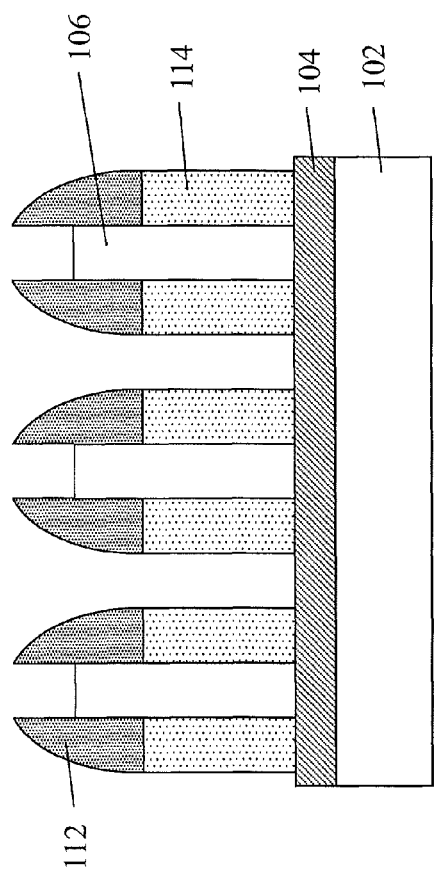
Figure 7:
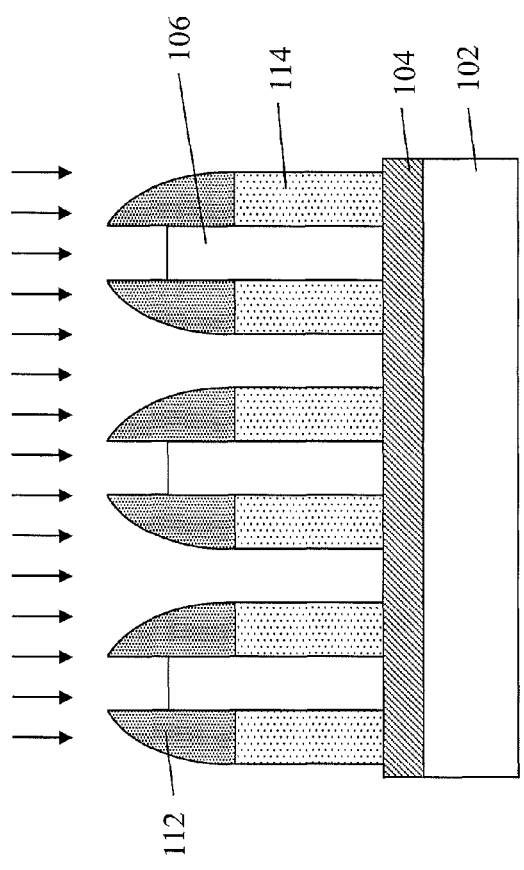
Figure 8:
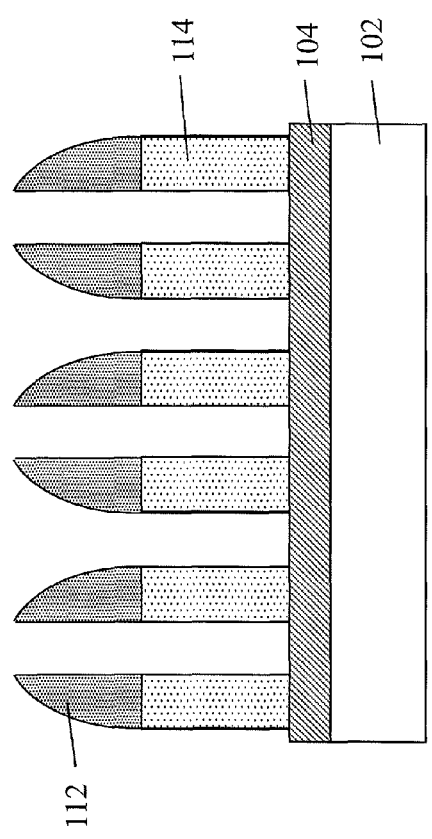
Figure 9:
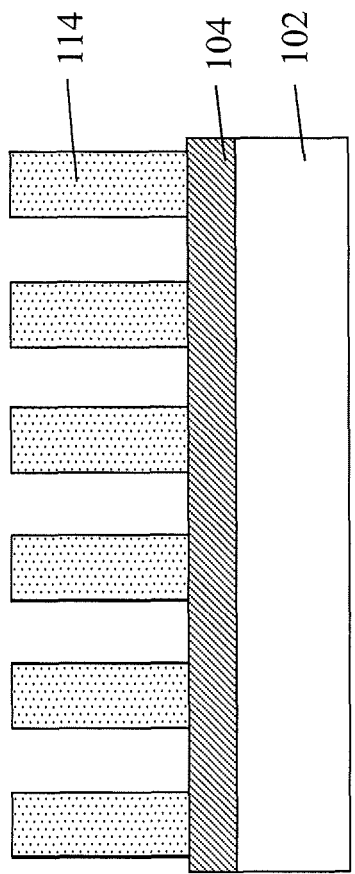

FIG. 6 illustrates the removal of the hardmask layer 108 from atop the Si template fins 106. This exposes the sacrificial Si template fins 106 for removal, while the spacers 112 are still temporarily left in place. A dry etch process, such as a reactive ion etch (RIE) indicated by the arrows in FIG. 7, is used to remove the Si template fins 106. As such an RIE process may otherwise attack the SiGe fins 114, the nitride spacers 112 protect the integrity of the SiGe fins 114 until the sacrificial Si template fins 106 are completely removed, as shown in FIG. 8. The nitride spacers 112 are thereafter removed, leaving the epitaxially grown SiGe fins 114, as shown in FIG. 9.

Figure 10:
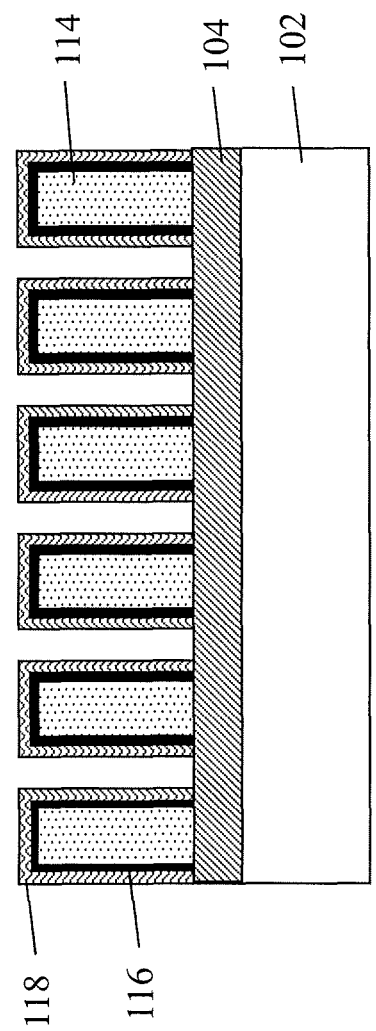
Figure 11:
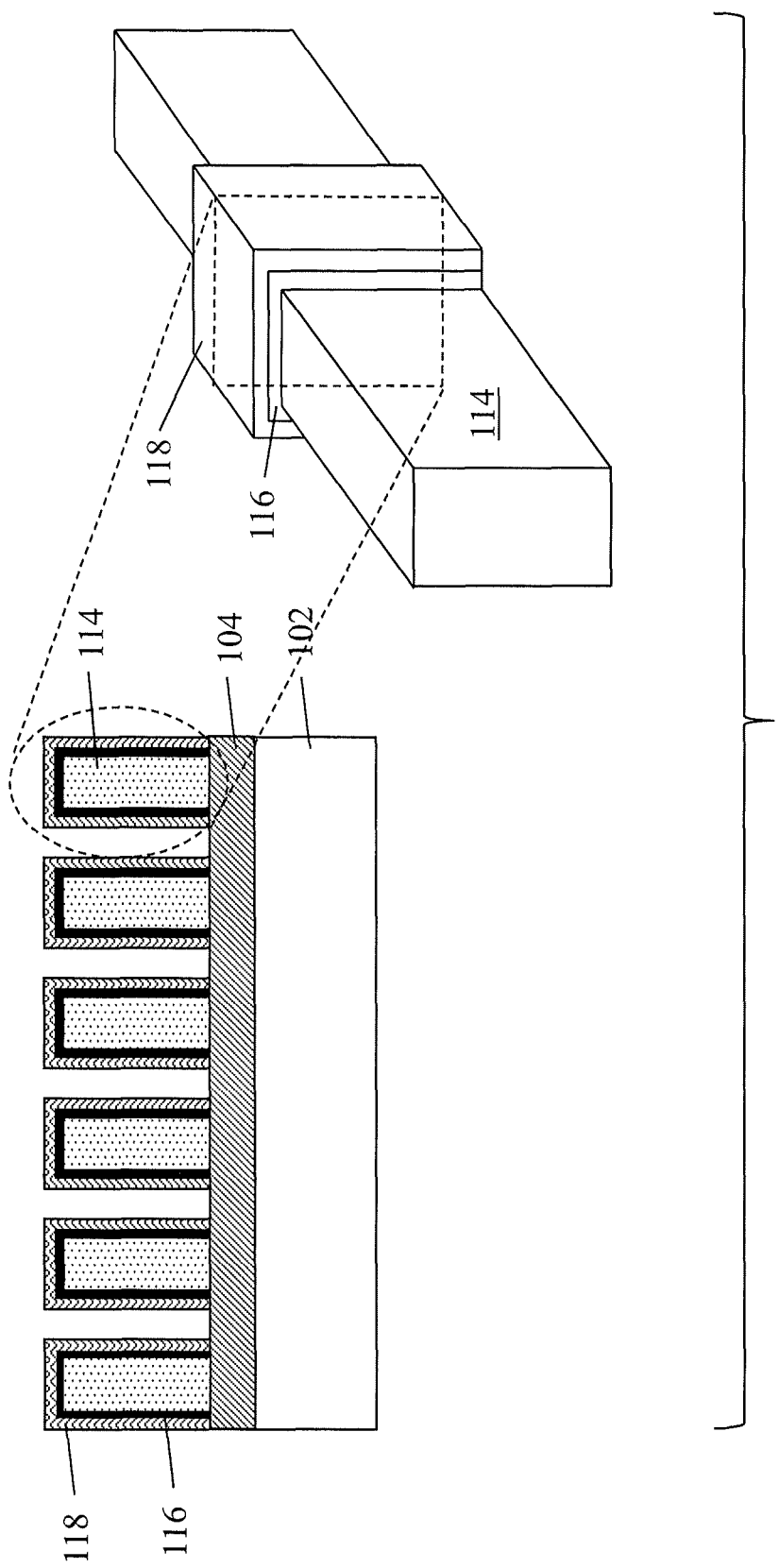

At this point, additional processing is performed in accordance with FET device techniques including, for example: dummy gate stack formation in the case of replacement gate FET devices (e.g., gate oxide deposition, amorphous or polysilicon deposition, hardmask deposition, lithography and gate patterning), spacer formation (e.g., silicon nitride, oxide), epitaxial source/drain fin merging, source/drain formation (implantation/anneal), ILD formation, and dummy gate removal. As such processing operations are known to those skilled in the art, the details thereof are omitted herein. However, by way of one specific (but non-limiting) example, FIG. 10 illustrates an exemplary gate formation process on the SiGe fins 114, with FIG. 11 further illustrating a perspective view of one of the fins 114 shown in FIG. 10.

In the example depicted, a high-k metal gate stack is formed over the SiGe fins 114, including one or more high-k dielectric layers 116 and one or more metal workfunction and metal gate layers 118. Specific examples of high-k dielectric materials include, but are not limited to: $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the high-k dielectric layer 118 may be from about 1 nm to about 10 nm, and more specifically from about 1.5 nm to about 3 nm. The one or more metal workfunction and metal gate layers 118 may include, for example, a wetting titanium nitride deposition layer, and one or more of aluminum, titanium-doped aluminum, tungsten or copper.

Figure 12:
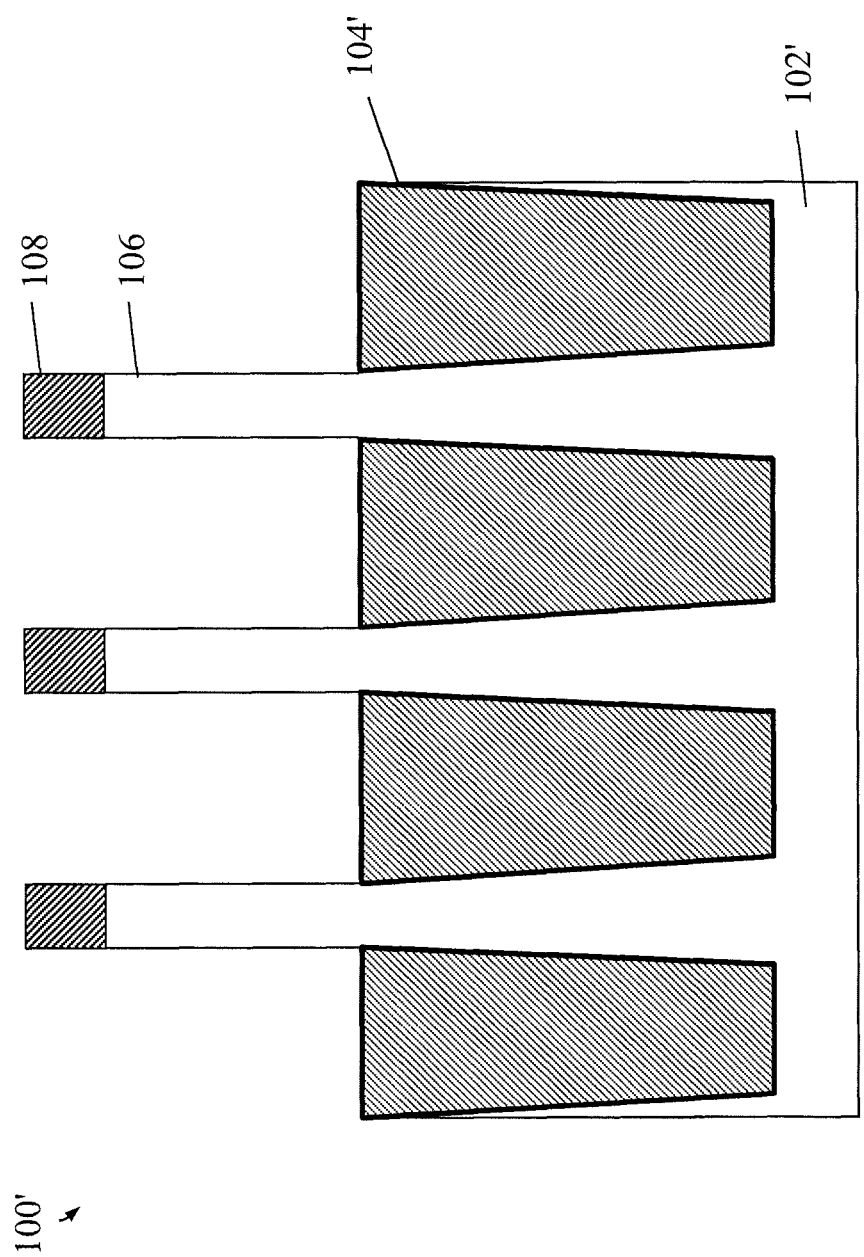
FIG. 12 illustrates the formation of template fins patterned from a bulk semiconductor substrate, in accordance with an alternative embodiment.

From this point, conventional processing as known in the art may continue including, for example, chemical mechanical polishing (CMP) of the gate metal layers, silicide contact formation for gate, source and drain terminals, upper level wiring formation, etc. It should be appreciated that although the above described embodiments are presented in terms of an SOI substrate, the techniques are also equally applicable to bulk semiconductor substrates. For example, FIG. 12 illustrates a starting semiconductor structure 100' in accordance with an alternative embodiment, and includes a bulk semiconductor substrate 102', a plurality of shallow trench isolation regions 104' formed in the bulk semiconductor substrate 102', and a plurality of sacrificial template fins 106 with hardmask layer 108 patterned from the bulk semiconductor material. Again, the bulk semiconductor substrate 102' may include a material such as, for example, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Once the sacrificial fins are formed, the same processing operations may be performed as described in conjunction with FIGS. 2-11.

It will also be appreciated that the above described process of epitaxially growing SiGe fins on sidewall surfaces of sacrificial template Si fins provides the capability of forming taller SiGe fins above a critical thickness limit that results from growing a SiGe layer on a planar Si substrate, and then patterning the SiGe layer to form the fins.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of forming semiconductor fins, the method comprising:
   forming a plurality of sacrificial template fins from a first semiconductor material;
   forming sidewall spacers on upper portions of the sacrificial template fins, leaving lower portions of the sacrificial template fins exposed;
   epitaxially growing fins of a second semiconductor material on exposed sidewall surfaces of the sacrificial template fins; and
   removing the plurality of sacrificial template fins.

2. The method of claim 1, wherein the first semiconductor material comprises silicon (Si) and the second semiconductor material comprises silicon germanium (SiGe).

3. The method of claim 1, wherein removing the plurality of sacrificial template fins further comprises removing a hardmask layer from a top surface of the sacrificial template fins and performing an etch process, such that the epitaxially grown fins of the second semiconductor material are protected from the etch process by the sidewall spacers.

4. The method of claim 3, further comprising removing the sidewall spacers following removing the plurality of sacrificial template fins.

5. The method of claim 1, wherein forming the sidewall spacers further comprises:
   depositing a protective material over the plurality of sacrificial template fins;
   recessing the protective material to expose the upper portions of the sacrificial template fins; and
   depositing a sidewall spacer layer over the exposed upper portions of the sacrificial template fins, and directionally etching the sidewall spacer layer to form the sidewall spacers.

6. The method of claim 5, wherein the protective material comprises a flowable oxide material.

7. A method of forming semiconductor fins, the method comprising:
   forming a plurality of sacrificial silicon template fins from a silicon layer;
   forming sidewall spacers on upper portions of the sacrificial template fins, leaving lower portions of the sacrificial template fins exposed;
   epitaxially growing silicon germanium (SiGe) fins on exposed sidewall surfaces of the sacrificial silicon template fins; and
   removing the plurality of sacrificial silicon template fins.

8. The method of claim 7, wherein removing the plurality of sacrificial template fins further comprises removing a hardmask layer from a top surface of the sacrificial silicon template fins and performing an etch process, such that the epitaxially grown SiGe fins of the second semiconductor material are protected from the etch process by the sidewall spacers.

9. The method of claim 8, further comprising removing the sidewall spacers following removing the plurality of sacrificial silicon template fins.

10. The method of claim 7, wherein forming the sidewall spacers further comprises:
    depositing a flowable oxide material over the plurality of sacrificial silicon template fins;
    recessing the flowable oxide material to expose the upper portions of the sacrificial silicon template fins; and
    depositing a nitride spacer layer over the exposed upper portions of the sacrificial silicon template fins and the hardmask layer, and directionally etching the nitride spacer layer to form the sidewall spacers.

11. The method of claim 10, wherein the hardmask layer has an etch selectivity to oxide.

12. The method of claim 11, wherein the hardmask layer comprises amorphous carbon.

13. The method of claim 7, wherein the silicon layer has an initial thickness that exceeds a height of the epitaxially grown SiGe fins.

14. The method of claim 13, wherein the height of the epitaxially grown SiGe fins is from about 20 nanometers (nm) to about 60 nm.

* * * * *